United States Patent [19]

Hu et al.

[11] Patent Number: 5,656,951

[45] Date of Patent: Aug. 12, 1997

[54] INPUT CIRCUIT AND METHOD FOR HOLDING DATA IN MIXED POWER SUPPLY MODE

[75] Inventors: Tzu-Hui P. Hu, Tempe; Barry B. Heim, Mesa, both of Ariz.

[73] Assignee: Motorola, Inc., Schaumburg, Ill.

[21] Appl. No.: 596,856

[22] Filed: Feb. 5, 1996

[51] Int. Cl.[6] ............... H03K 19/0948; H03K 19/017
[52] U.S. Cl. ................... 326/81; 326/17; 326/86; 327/198; 327/210
[58] Field of Search .................. 326/17, 81, 83, 326/86, 21, 23, 24, 27, 44–45; 327/198, 210–211, 202–203, 215

[56] References Cited

U.S. PATENT DOCUMENTS

| | | | |
|---|---|---|---|
| 4,451,745 | 5/1984 | Itoh et al. | 326/83 |
| 4,481,432 | 11/1984 | Davies, Jr. | 326/58 |
| 4,649,296 | 3/1987 | Shoji | 326/83 |
| 4,901,280 | 2/1990 | Patel . | |
| 5,266,849 | 11/1993 | Kitahara et al. . | |
| 5,321,399 | 6/1994 | Notani et al. | 327/203 |
| 5,352,942 | 10/1994 | Tanaka et al. . | |
| 5,422,591 | 6/1995 | Rastegar et al. . | |
| 5,432,462 | 7/1995 | Obregón et al. . | |
| 5,497,114 | 3/1996 | Shimozono et al. | 327/210 |

*Primary Examiner*—Edward P. Westin
*Assistant Examiner*—Jon Santamauro
*Attorney, Agent, or Firm*—Ziye Zhou; Rennie William Dover

[57] ABSTRACT

An input circuit (10) includes two inverters (12, 16) and an enable transistor (18). When a logic high enable signal is transmitted to a gate electrode of the enable transistor (18). The two inverters (12, 16) form a latch that holds the data at the input port (21) of the input circuit (10). When a logic low enable signal is transmitted to the gate electrode of the enable transistor (18), the latch formed by the two inverters (12, 16) is disabled, thereby allowing fast data transmission through the input circuit (10). When the voltage at the input port (21) is higher than a supply voltage of the input circuit (10), the enable transistor (18) switches off to protect a voltage supply coupled to the input circuit (10).

18 Claims, 2 Drawing Sheets

INPUT CIRCUIT AND METHOD FOR HOLDING DATA IN MIXED POWER SUPPLY MODE

BACKGROUND OF THE INVENTION

The present invention relates, in general, to an input circuit and, in particular, to an input circuit capable of holding data without degrading the performance of the input circuit.

Typically, a logic circuit, such as, for example, a transistor-transistor logic (TTL) circuit, includes an input circuit, e.g., an input buffer, as an interface between a data bus and a circuit that receives an input signal from the data bus. An input circuit generally includes two inverters forming a latch, wherein the input of one inverter is coupled to the output of the other inverter. The input of the first inverter is also coupled to the data bus. The latch generates a logic signal at the input of the first inverter and the generated signal represents data that has the same logic value as the input signal. Because of the latch, the signal at the input of the first inverter continues to represent data having the same logic value even after the data bus enters a high impedance state. Therefore, the input circuit has the capability of holding data.

When the input signal at the data bus switches from one logic voltage level to another logic voltage level, the voltage level at the input of the first inverter remains unchanged because of the latch. The interaction between the signals generated by the latch and the data bus degrades the switching speed of the input circuit, thereby degrading the high frequency performance of the input circuit.

In complementary metal oxide semiconductor (CMOS) logic circuits, an inverter in the input circuit comprises a p-channel insulated gate field effect transistor (FET) and an n-channel insulated gate FET. The source electrodes of the p-channel and n-channel FETs are coupled to a high side and ground, respectively, of a voltage supply. The gate electrodes of the two FETs are coupled together and serve as the input of the inverter. The drain electrodes of the two FETs are coupled together and serve as the output of the inverter. When the voltage at the data bus is higher than the supply voltage of the input circuit, a body diode of the p-channel FET in the second inverter becomes forward biased. Thus, a current path is established from the data bus to the voltage supply of the input circuit via the drain, substrate, and source of the p-channel FET in the second inverter. The current flowing from a high voltage data bus to a low voltage supply of the input circuit may damage the voltage supply.

A diode can be inserted between the voltage supply and the source electrode of the p-channel FET in the second inverter or inserted between the drain electrode of the p-channel FET in the second inverter and the output of the second inverter to stop current flowing from the data bus to the voltage supply. The inserted diode is orientated so that the diode is reverse biased when the voltage at the data bus is higher than the supply voltage. In order to minimize the degradation of logic signals generated by the second inverter, the inserted diode is preferably a Schottky diode because of its low forward bias voltage drop. However, inserting a diode in a CMOS circuit requires bipolar-CMOS (BiCMOS) process, which is more complicated and costly than a pure CMOS process.

Accordingly, it would be advantageous to have an input circuit and a method for holding data. It is desirable for the input circuit to be able to protect a voltage supply against a high voltage at the data bus. It is also desirable for the input circuit to operate without sacrificing the speed of data transmission. Furthermore, it would be advantageous for the input circuit to be manufacturable using a simple and cost effective process.

DETAILED DESCRIPTION OF THE DRAWINGS

Figure 1:
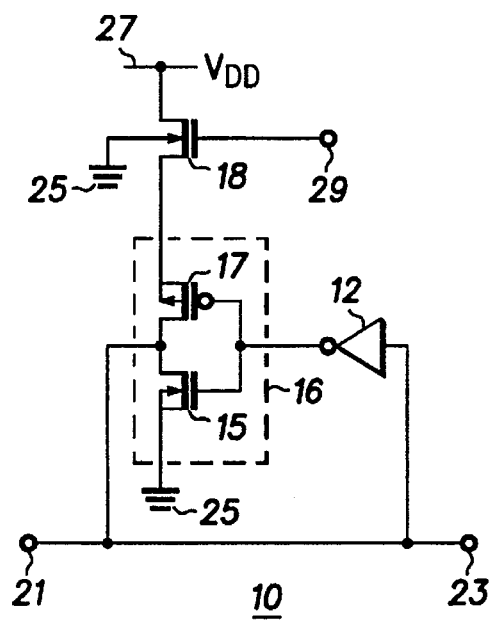
FIG. 1 is a schematic diagram of an input circuit in accordance with a first embodiment of the present invention.

FIG. 1 is a schematic diagram of an input circuit 10 in accordance with a first embodiment of the present invention. Input circuit 10 includes two drive circuits, i.e. inverters 12 and 16, and a n-channel insulated gate FET 18. An input of inverter 12 serves as an input port 21 for receiving an input signal of input circuit 10 from a data bus (not shown in FIG. 1) as well as an output port 23 for transmitting an output signal of input circuit 10. Inverter 16 includes an n-channel insulated gate FET 15 and a p-channel insulated gate FET 17. The gate electrodes of FETs 15 and 17 are connected together serving as an input of inverter 16, which is connected to an output of inverter 12. A source electrode of FET 15 is coupled for receiving a biasing voltage, e.g., ground, identified by reference number 25. A source electrode of FET 17 serves as a second biasing node of inverter 16 and is connected to a source electrode of FET 18. It should be noted that the source electrodes of FETs 15 and 17 serve as biasing nodes for inverter 16. A drain electrode of FET 18 is coupled for receiving a supply voltage $V_{DD}$ via a node 27. It should be noted that $V_{DD}$ in FIG. 1 refers to the voltage level at node 27, not a voltage supply that is coupled to node 27. A gate electrode of FET 18 is coupled for receiving an enable signal via a port 29. The drain electrodes of FETs 15 and 17 are commonly connected forming an output of inverter 16, which is connected to the input of inverter 12.

It should be noted that FETs 15 and 17 are also referred to as drive transistors for inverter 16. More particularly, FET 15 is referred to as a pull-down transistor and FET 17 is referred to as a pull-up transistor for inverter 16. FET 18 serves as an enable transistor for inverter 16. When FET 18 is conductive, a current path from $V_{DD}$ at node 27 to the source electrode of FET 17 is established, thereby enabling inverter 16. When FET 18 is non-conductive, the current path from $V_{DD}$ at node 27 to the source electrode of FET 17 is open or broken, thereby disabling inverter 16.

It should be understood that FETs 15, 17, and 18 are not limited to being insulated gate field effect transistors as shown in FIG. 1. FETs 15, 17, and 18 serve as switches and can be replaced by any switch device that has a control electrode and two current conducting electrodes. For example, FETs 15, 17, and 18 can be replaced with bipolar transistors, metal semiconductor transistors, junction field effect transistors, or the like. As those skilled in the art are aware, for a field effect transistor, a gate electrode serves as a control electrode and the source and drain electrodes serve as current conducting electrodes of the switching device. Likewise, for a bipolar transistor, a base electrode serves as a control electrode and the emitter and collector electrodes serve as current conducting electrodes of the switching device.

Although output port 23 of input circuit 10 is connected to the input of inverter 12 in the embodiment shown in FIG. 1, this is not intended as a limitation of the present invention. In an alternative embodiment, output port 23 is connected to the output of inverter 12. In the embodiment shown in FIG. 1, the output signal of input circuit 10 has the same logic value as the input signal of input circuit 10, whereas in the alternative embodiment, the output signal has a logic value complementary to the input signal.

When there is a defined logic signal, such as a logic high signal or a logic low signal, transmitted to input port 21, the enable signal at port 29 is set to a logic low voltage level, e.g., ground, switching off FET 18. Thus, inverter 16 is disabled and a signal at input port 21 is transmitted to output port 23 without interference from the output signal of inverter 16. In addition, because FET 18 is non-conductive, current cannot flow from input port 21 to node 27. Therefore, a voltage supply (not shown in FIG. 1) that provides the biasing voltages for inverter 16 via node 27 is protected from damage caused by a high voltage at input port 21.

When the data bus (not shown in FIG. 1) coupled to input port 21 enters a high impedance state, the enable signal at port 29 switches to a logic high voltage level, e.g., $V_{DD}$. A high impedance state is also referred to as a tristate in logic circuits. FET 18 is switched on and inverter 16 is enabled. Inverters 12 and 16 form a latch.

If the signal at input port 21 is at a logic high voltage level and the data bus enters the high impedance state, inverter 12 generates a logic low voltage level at the input of inverter 16, which in turn generates a logic high voltage level at the input of inverter 12. After the data bus enters the high impedance state, the latch formed by inverters 12 and 16 maintains the logic high voltage level at the input of inverter 12. Thus, the voltage at output port 23 is latched at a logic high voltage level.

If the signal at input port 21 is at a logic low voltage level and the data bus enters the high impedance state, inverter 12 generates a logic high voltage level at the input of inverter 16, which in turn generates a logic low voltage level at the input of inverter 12. After the data bus enters the high impedance state, the latch formed by inverters 12 and 16 maintains the logic low voltage level at the input of inverter 12. Thus, the voltage at output port 23 is latched at a logic low voltage level.

In both situations, input circuit 10 holds the data transmitted from the data bus to input port 21 before the data bus enters the high impedance state. The voltage levels at the inputs of inverters 12 and 16 always have defined logic voltage values. It should be understood that in CMOS circuits, a drive circuit having a defined logic voltage level at its input does not leak current. Therefore, the present invention prevents the leakage current from flowing.

If the voltage at the data bus coupled to input port 21 is higher than the supply voltage $V_{DD}$ at node 27, a body diode between the drain and substrate of FET 17 becomes forward biased. A current path is established from input port 21 to the source electrode of FET 18 via the drain, substrate, and source of FET 17. The voltage at the source electrode is substantially equal to the voltage at input port 21 which is higher than $V_{DD}$. Because the voltages at the gate electrode and the drain electrode of FET 18 are equal to VDD, a voltage higher than $V_{DD}$ at the source electrode of FET 18 switches FET 18 off, thereby stopping a current flowing through FET 18. Therefore, the voltage supply (not shown in FIG. 1) of input circuit 10 coupled to node 27 is protected from damage caused by a high voltage which may appear at input port 21.

Input circuit 10 can be a circuit operating at one voltage level, e.g., three volts, and interfaced with a data bus operating at a higher voltage level, e.g., five volts. FET 18 protects the voltage supply coupled to node 27 from damage that may be caused by a high voltage bus coupled to input port 21. Thus, input circuit 10 is capable of operating in a mixed power supply mode. To ensure proper protection of the voltage supply coupled to node 27, the voltage level of the enable signal at port 29 preferably has an upper limit equal to $V_{DD}$. Because the latch formed by inverters 12 and 16 is disabled when a signal is transmitted to input circuit 10 via input port 21, it does not degrade data transmission speed of input circuit 10. In order to minimize the data degradation at the output of inverter 16, FET 18 preferably is a low threshold FET having a threshold voltage lower than that of FET 15. In one embodiment, FET 18 has a threshold voltage of approximately 0.3 volt or lower.

Figure 2:
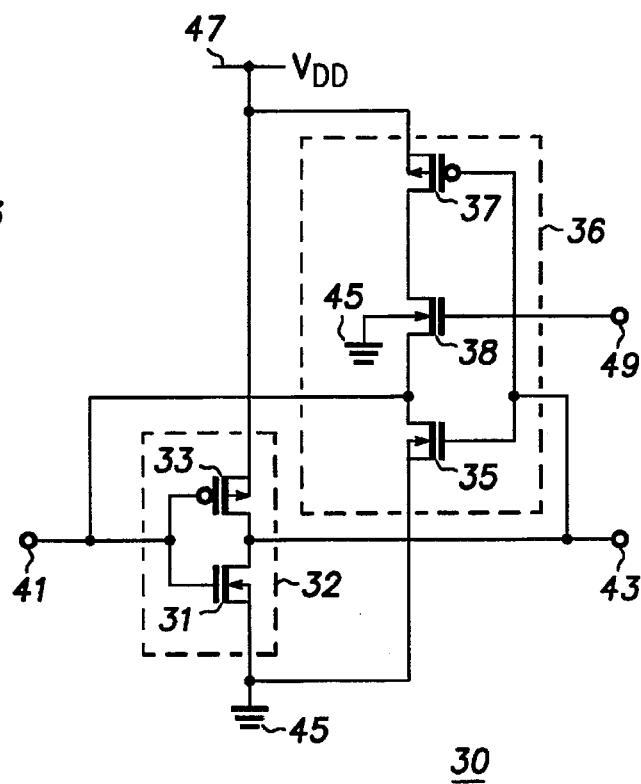
FIG. 2 is a schematic diagram of an input circuit in accordance with a second embodiment of the present invention.

FIG. 2 is a schematic diagram of an input circuit 30 in accordance with a second embodiment of the present invention. Input circuit 30 includes two drive circuits, i.e. inverters 32 and 36. Inverter 32 includes an n-channel insulated gate FET 31 and a p-channel insulated gate FET 33. The gate electrodes of FETs 31 and 33 are commonly connected and serve as an input of inverter 32 as well as an input port 41 of input circuit 30 for receiving an input signal from a data bus (not shown in FIG. 2). A source electrode of FET 31 is coupled for receiving a biasing voltage, e.g., ground, identified by reference number 45. A source electrode of FET 33 is coupled for receiving a biasing voltage $V_{DD}$, via a node 47. It should be noted that $V_{DD}$ in FIG. 2 refers to the voltage level at node 47, not a voltage supply that is coupled to node 47. The drain electrodes of FETs 31 and 33 are commonly connected, forming an output of inverter 32 which serves as an output port 43 for transmitting an output signal of input circuit 30. Inverter 36 includes n-channel insulated gate FETs 35 and 38 and a p-channel insulated gate FET 37. The gate electrodes of FETs 35 and 37 are commonly connected, forming an input of inverter 36 which is connected to the output of inverter 32. A source electrode of FET 35 is coupled to ground 45. A source electrode of FET 37 is coupled to $V_{DD}$ at node 47. It should be noted that the source electrodes of FETs 35 and 37 are also referred to as the biasing nodes of inverter 36. A drain electrode of FET 37 is connected to a drain electrode of FET 38. A gate electrode of FET 38 is connected for receiving an enable signal via a port 49. A source electrode of FET 38 is connected to the drain electrode of FET 35, forming an output of inverter 36, which is connected to the input of inverter 32.

It should be understood that FETs 31 and 33 of inverter 32 and FETs 35, 37, and 38 of inverter 36 are not limited to being insulated gate field effect transistors as shown in FIG. 2. FETs 31, 33, 35, 37, and 38 serve as switches and can be replaced by any switch device that has a control electrode and two current conducting electrodes. For example, FETs 31, 33, 35, 37, and 38 can be replaced with bipolar transistors, metal semiconductor transistors, junction field effect transistors, or the like.

Although output port 43 of input circuit 30 is connected to the output of inverter 32 in the embodiment shown in FIG. 2, this is not intended as a limitation of the present invention. In an alternative embodiment, output port 43 is connected to the input of inverter 32. In the embodiment shown in FIG.

2, the output signal of input circuit 30 has a logic value complementary to the input signal of input circuit 30. In the alternative embodiment, the output signal has the same logic value as the input signal.

When there is a defined logic signal transmitted to input port 41, the enable signal at port 49 is set to a logic low voltage level, e.g., ground. Thus, FET 38 is switched off, opening a current path from input port 41 to $V_{DD}$. A signal at input port 41 is transmitted to output port 43 via inverter 32 without interference from the output signal of inverter 36. In addition, because FET 38 is non-conductive, current cannot flow from input port 41 to node 47. Therefore, a voltage supply (not shown in FIG. 2) that provides the biasing voltages for input circuit 30 is protected from damage caused by a high voltage that may appear at input port 41.

When the data bus (not shown in FIG. 2) which is coupled to input port 41 enters a high impedance state, the enable signal at port 49 switches to a logic high voltage level, e.g., $V_{DD}$ and switches on FET 38. Therefore, inverter 36 is enabled and forms a latch with inverter 32.

If the signal at input port 41 is at a logic high voltage level and the data bus enters the high impedance state, inverter 32 generates a logic low voltage level at the input of inverter 36, which in turn generates a logic high voltage level at the input of inverter 32. After the data bus enters the high impedance state, the latch formed by inverters 32 and 36 maintains the logic high voltage level at the input of inverter 32. Thus, the voltage at output port 43 is latched at a logic low voltage level.

If the signal at input port 41 is at a logic low voltage level and the data bus enters the high impedance state, inverter 32 generates a logic high voltage level at the input of inverter 36, which in turn generates a logic low voltage level at the input of inverter 32. After the data bus enters the high impedance state, the latch formed by inverters 32 and 36 maintains the logic low voltage level at the input of inverter 32. Thus, the voltage at output port 43 is latched at a logic high voltage level.

In both situations, input circuit 30 holds the data transmitted from the data bus to input port 41 before the data bus enters the high impedance state. The voltage at the inputs of inverters 32 and 36 always have defined logic values. It should be noted that in CMOS circuits, a drive circuit having a defined logic voltage level at its input does not leak current. Therefore, the present invention prevents leakage current from flowing.

If the voltage at the data bus coupled to input port 41 is higher than the supply voltage $V_{DD}$, a body diode between the drain and substrate of FET 37 becomes forward biased. A current flows from input port 41 to node 47 via FET 38 and FET 37. Because the voltage at gate electrode of FET 38 is equal to $V_{DD}$, FET 38 is switched off when the voltage at the drain electrode of FET 38 approaches $V_{DD}$, thereby stopping the current flowing from input port 41 to node 47 via FET 38. Therefore, the voltage supply (not shown in FIG. 2) of input circuit 30 is protected from damage caused by a high voltage that may appear at input port 41.

Input circuit 30 can be a circuit operating at one voltage level, e.g., three volts, and interfaced with a data bus operating at a higher voltage, e.g., five volts. FET 38 protects the voltage supply coupled to node 47 from damage that may be caused by a high voltage bus coupled to input port 41. Therefore, input circuit 30 is capable of operating in a mixed power supply mode. To ensure proper protection of the voltage supply coupled to node 47, the voltage level of the enable signal at port 49 preferably has an upper limit equal to $V_{DD}$. Because the latch formed by inverters 32 and 36 is disabled by the enable signal at port 49 when a signal is transmitted to input circuit 30 via input port 41, it does not degrade data transmission speed of input circuit 30. In order to minimize the data degradation at the output of inverter 36, FET 38 preferably is a low threshold FET having a threshold voltage lower than that of FETs 31 and 35. In one embodiment, the threshold voltage of FET 38 has an upper limit of approximately 0.3 volt.

Figure 3:
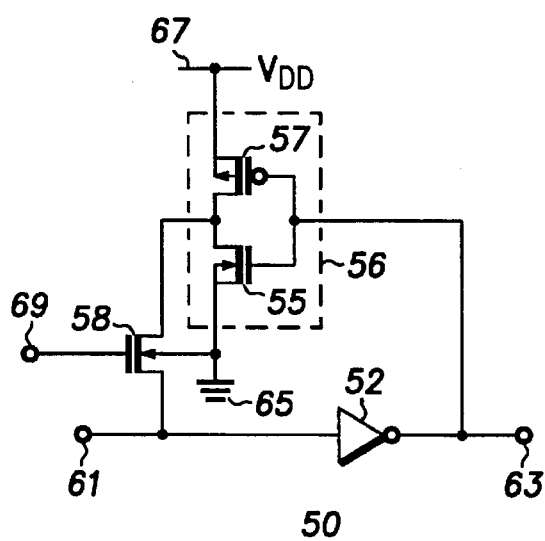
FIG. 3 is a schematic diagram of an input circuit in accordance with a third embodiment of the present invention.

FIG. 3 is a schematic diagram of an input circuit 50 in accordance with a third embodiment of the present invention. Input circuit 50 includes two drive circuits, i.e. inverters 52 and 56, and an n-channel insulated gate FET 58. An input of inverter 52 serves as an input port 61 for receiving an input signal of input circuit 50 from a data bus (not shown in FIG. 3). An output of inverter 52 serves as an output port 63 for transmitting an output signal of input circuit 50. Inverter 56 includes an n-channel insulated gate FET 55 and a p-channel insulated gate FET 57. The gate electrodes of FETs 55 and 57 are connected together and serve as an input of inverter 56, which is connected to the output of inverter 52. A source electrode of FET 55 is coupled fore for receiving a biasing voltage, e.g., ground, identified by reference number 65. A source electrode of FET 57 is coupled fore for receiving a biasing voltage, e.g., $V_{DD}$, at a node 67. It should be noted that $V_{DD}$ in FIG. 3 refers to the voltage level at node 67, not a voltage supply that is coupled to node 67. It should also be noted that the source electrodes of FETs 55 and 57 serve as biasing nodes for inverter 56. The drain electrodes of FETs 55 and 57 are commonly connected, forming an output of inverter 56, which is connected to a drain electrode of FET 58. A source electrode of FET 58 is connected to the input of inverter 52. A gate electrode of FET 58 is coupled for receiving an enable signal via a port 69.

It should be understood that FETs 55 and 57 of inverter 56 and FET 58 are not limited to being insulated gate field effect transistors as shown in FIG. 3. FETs 55, 57, and 58 serve as switches and can be replaced by any switch device that has a control electrode and two current conducting electrodes. For example, FETs 55, 57, and 58 can be replaced with bipolar transistors, metal semiconductor transistors, junction field effect transistors, or the like.

Although output port 63 of input circuit 50 is connected to the output of inverter 52 in the embodiment shown in FIG. 3, this is not intended as a limitation of the present invention. In an alternative embodiment, output port 63 is connected to the input of inverter 52. In the embodiment shown in FIG. 3, the output signal of input circuit 50 has a logic value complementary to the input signal of input circuit 50. In the alternative embodiment, the output signal has the same logic value as the input signal.

When there is a defined logic signal transmitted to input port 61, the enable signal at port 69 is set to a logic low voltage level, e.g., ground. Thus, FET 58 is switched off, thereby stopping the output signal of inverter 56 from being transmitted to the input of inverter 52. Therefore, a latch formed by inverters 52 and 56 is disabled. A signal at input port 61 is transmitted to output port 63 via inverter 52 without interference from the output signal of inverter 56. In addition, because FET 58 is non-conductive, a current cannot flow from input port 61 to node 67. Therefore, a voltage supply (not shown in FIG. 3) that provides the biasing voltages for input circuit 30 via nodes 67 is protected from damage caused by a high voltage that may appear at input port 61.

When the data bus (not shown in FIG. 3) coupled to input port 61 enters a high impedance state, the enable signal at port 69 switches to a logic high voltage level, e.g., $V_{DD}$. FET 58 is switched on and the latch formed by inverters 52 and 56 is enabled.

If the signal at input port 61 is at a logic high voltage level and the data bus enters the high impedance state, inverter 52 generates a logic low voltage level at the input of inverter 56, which in turn generates a logic high voltage level at the input of inverter 52. After the data bus enters the high impedance state, the latch formed by inverters 52 and 56 maintains the logic high voltage level at the input of inverter 52. Thus, the voltage at output port 63 is latched at a logic low voltage level.

If the signal at input port 61 is at a logic low voltage level and the data bus enters the high impedance state, inverter 52 generates a logic high voltage level at the input of inverter 56, which in turn generates a logic low voltage level at the input of inverter 52. After the data bus enters the high impedance state, the latch formed by inverters 52 and 56 maintains the logic low voltage level at the input of inverter 52. Thus, the voltage at output port 63 is latched at a logic high voltage level.

In both situations, input circuit 50 holds the data transmitted from the data bus to input port 61 before the data bus enters the high impedance state. The voltages at the inputs of inverters 52 and 56 always have defined logic voltage values. It should be noted that in CMOS circuits, a drive circuit having a defined logic voltage level at its input does not leak current. Therefore, the present invention prevents leakage current from flowing.

If the voltage at the data bus coupled to input port 61 is higher than the supply voltage $V_{DD}$ at node 67, a body diode between the drain and substrate of FET 57 becomes forward biased. A current flows from input port 61 to node 67 via FET 58 and FET 57. Because the voltage at the gate electrode of FET 58 is equal to $V_{DD}$, FET 58 is switched off when the voltage at the drain electrode of FET 57 approaches $V_{DD}$, thereby stopping the current flowing from input port 61 to node 67 via FET 58. Therefore, the voltage supply (not shown in FIG. 3) of input circuit 50 is protected from damage caused by a high voltage that may appear at input port 61.

Input circuit 50 can be a circuit operating at one voltage level, e.g., three volts, and interfaced with a data bus operating at a higher voltage, e.g., five volts. FET 58 protects the voltage supply coupled to node 67 from damage that may be caused by a high voltage bus coupled to input port 61. In other words, input circuit 50 is capable of operating in a mixed power supply mode. To ensure proper protection of the voltage supply coupled to node 67, the voltage level of the enable signal at port 69 preferably has an upper limit equal to $V_{DD}$. Because the latch formed by inverters 52 and 56 is disabled by the enable signal at port 69 when a signal is transmitted to input circuit 50 via input port 61, it does not degrade data transmission speed of input circuit 50. In order to minimize the data degradation at the output of inverter 56, FET 58 preferably is a low threshold FET having a threshold voltage lower than that of FET 55. In one embodiment, the threshold voltage of FET 58 equal to or less than approximately 0.3 volt.

Figure 4:
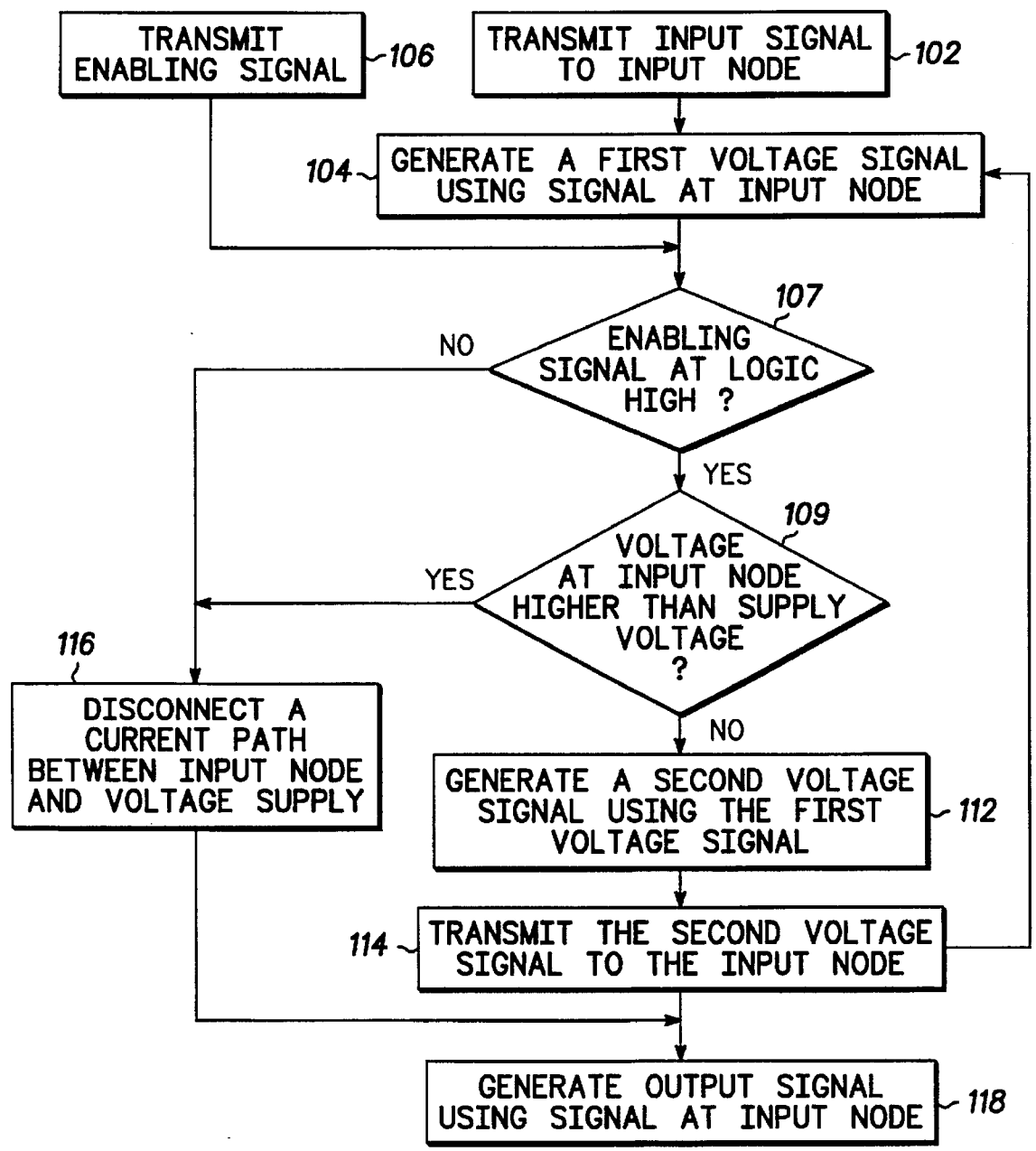
FIG. 4 is a flow chart of a method for holding data in accordance with an embodiment of the present invention.

FIG. 4 is a flow chart 100 of a method for holding data represented by an input signal transmitted to an input circuit via a data bus in accordance with various embodiments of the present invention. The input circuit includes two inverters. A supply voltage, such as $V_{DD}$ in FIGS. 1, 2 and 3 and ground voltage provide the biasing voltage for the two inverters. The input circuit is coupled for receiving an input signal, for receiving an enable signal, and for transmitting an output signal.

A data bus coupled to an input port of the input circuit transmits an input signal to the input circuit (step 102). The logic state of the input signal is set in accordance with the logic state of the data bus. The first inverter of the input circuit generates a first voltage signal having a logic value complementary to that of the signal at the input port (step 104).

An enable signal is also transmitted to the input circuit (step 106). When the data bus has a defined logic state, such as a logic high state or a logic low state, the enable signal is at a logic low state. When the data bus enters a high impedance state, the enable signal switches to a logic high state. The logic state of the enable signal is verified (step 107) and the voltage at the input port is compared with the supply voltage of the input circuit (step 109).

If the enable signal is at a logic high state and the voltage at the input port is not higher than the supply voltage, the second inverter of the input circuit is enabled and generates a second voltage signal having a logic value complementary to that of the first voltage (step 112). The second voltage signal is transmitted to the input port (step 114). The first inverter receives the second voltage signal transmitted to its input port and generates a complementary voltage signal at its output (step 104). Therefore, the two inverters of the input circuit form a latch which holds data of the input signal which was transmitted from the data bus.

If the enable signal is at a logic low state or the voltage at the input port is higher than the supply voltage, a transistor is switched off to break or disconnect a current path between the input port and the voltage supply of the input circuit via the second inverter (step 116). The latch formed by the two inverters of the input circuit is disabled, thereby disabling the data holding function of the input circuit and avoiding contention between the input circuit signed and the signal generated by the latch at the input port. Furthermore, the voltage supply of the input circuit is protected from the damage that the high voltage at the input port may cause.

An output signal is transmitted to an output port of the input circuit (step 118). In an input circuit like input circuit 10 shown in FIG. 1, the logic state of the output signal is the same as the logic state at the input port of the input circuit. In an input circuit like input circuit 30 shown in FIG. 2 or input circuit 50 shown in FIG. 3, the logic state of the output signal is complementary to the logic state of the signal at input port of the input circuit.

By now it should be appreciated that an input circuit and a method for holding data have been provided. When the data bus, which is coupled to the input port of the input circuit, enters a high impedance state, the input circuit stores and holds the data read from the data bus before the data bus enters the high impedance state. When the data bus is at a defined logic state, the data holding function of the input circuit is disabled so that the input circuit maintains a high speed of data transmission. When the voltage at the input port of the input circuit becomes higher than the supply voltage of the input circuit, a transistor in the current path from the input circuit to the voltage supply of the input circuit is switched off, thereby protecting the voltage supply from the damage that the high voltage at the input port may cause. Therefore, the input circuit of the present invention can be used as an interface between a low voltage logic circuit and a high voltage data bus. Furthermore, in accordance with the present invention, the input circuit can be fabricated using a pure CMOS process, which is simpler and more cost effective process than a BiCMOS process.

We claim:

1. An input circuit capable of operating in a mixed power supply mode, comprising:

a first drive circuit having an input and an output, wherein the input is coupled for receiving an input signal of the input circuit;

a second drive circuit which includes a p-channel field effect transistor and an n-channel field effect transistor having a first threshold voltage, wherein the p-channel field effect transistor has a gate electrode coupled to the output of the first drive circuit, a source electrode, and a drain electrode coupled to the input of the first drive circuit, and wherein the n-channel field effect transistor has a gate electrode coupled to the gate electrode of the p-channel field effect transistor, a source electrode coupled for receiving a first voltage, and a drain electrode coupled to the drain electrode of the p-channel field effect transistor; and a low threshold n-channel insulated gate field effect transistor having a gate electrode coupled for receiving an enable signal, a source electrode coupled to the source electrode of the p-channel field effect transistor of the second drive circuit, and a drain electrode coupled for receiving a second voltage, wherein the low threshold n-channel insulated gate field transistor has a second threshold voltage lower than the first threshold voltage.

2. The input circuit of claim 1, wherein the input of the first drive circuit is coupled for transmitting an output signal of the input circuit.

3. The input circuit of claim 1, wherein the output of the first drive circuit is coupled for transmitting an output signal of the input circuit.

4. The input circuit of claim 1, wherein the second threshold voltage is equal to or lower than approximately 0.3 volt.

5. An input circuit capable of operating in a mixed power supply mode, comprising:

an inverter having an input and an output, wherein the input is coupled for receiving an input signal of the input circuit;

an n-channel field effect transistor having a first threshold voltage, a gate electrode, a source electrode, and a drain electrode, wherein the gate electrode is coupled to the output of the inverter, the source electrode is coupled for receiving a first voltage, and the drain electrode is coupled to the input of the inverter;

a p-channel field effect transistor having a gate electrode, a source electrode, and a drain electrode, wherein the gate electrode is coupled to the gate electrode of the n-channel field effect transistor and the source electrode is coupled for receiving a second voltage; and a low threshold n-channel insulated gate field effect transistor having a gate electrode coupled for receiving an enable signal, a source electrode coupled to the drain electrode of the n-channel field effect transistor, and a drain electrode coupled to the drain electrode of the p-channel field effect transistor, wherein the low threshold n-channel insulated gate field effect transistor has a second threshold voltage lower than the first threshold voltage.

6. The input circuit of claim 5, wherein the input of the inverter is coupled for transmitting an output signal of the input circuit.

7. The input circuit of claim 5, wherein the output of the inverter is coupled for transmitting an output signal of the input circuit.

8. The input circuit of claim 5, wherein the second threshold voltage is equal to or lower than approximately 0.3 volt.

9. An input circuit capable of operating in a mixed power supply mode, comprising:

a first inverter having an input and an output, wherein the input is coupled for receiving an input signal of the input circuit;

a second inverter having an input coupled to the output of the first inverter and an output, the second inverter including:

an n-channel field effect transistor having a first threshold voltage, a gate electrode coupled to the input of the second inverter, a source electrode coupled for receiving a first voltage, and a drain electrode coupled to the output of the second inverter; and a p-channel field effect transistor having a gate electrode coupled to the gate electrode of the n-channel field effect transistor, a source electrode coupled for receiving a second voltage, and a drain electrode coupled to the drain electrode of the n-channel field effect transistor; and a low threshold n-channel insulated gate field effect transistor having a second threshold voltage, a gate electrode coupled for receiving an enable signal, a source electrode coupled to the input of the first inverter, and a drain electrode coupled to the output of the second inverter, wherein the second threshold voltage is lower than the first threshold voltage.

10. The input circuit of claim 9, wherein the input of the first inverter is coupled for transmitting an output signal of the input circuit.

11. The input circuit of claim 9, wherein the output of the first inverter is coupled for transmitting an output signal of the input circuit.

12. The input circuit of claim 9, wherein the second threshold voltage has an upper limit of approximately 0.3 volt.

13. A method for holding data, comprising the steps of:

providing an input circuit having a first biasing node coupled for receiving a first biasing voltage, a second biasing node coupled for receiving a second biasing voltage, and a low threshold n-channel insulated gate field effect transistor coupled between an input port of the input circuit and the second biasing node, wherein a threshold voltage of the low threshold n-channel insulated gate field effect transistor has an upper limit of approximately 0.3 volt;

coupling a gate electrode of the low threshold n-channel insulated gate field effect transistor for receiving an enable signal;

transmitting a logic signal corresponding to data having a first logic value to the input port of the input circuit;

disconnecting a current path from the input port to the second biasing node through the low threshold insulated gate field effect transistor in response to a voltage at the input port being higher than the second biasing voltage;

generating a first voltage, wherein the first voltage corresponds to a second logic value complementary to the first logic value; and generating a second voltage at the input port of the input circuit from the first voltage in response to the low threshold n-channel insulated gate field effect transistor being switched on by the enable signal being at a first voltage level, wherein the second voltage corresponds to the first logic value.

14. The method for holding data as claimed in claim 13, further comprising the step of transmitting the first voltage to an output port of the input circuit.

15. The method for holding data as claimed in claim 13, further comprising the step of transmitting a voltage level at the input port of the input circuit to an output port of the input circuit.

16. The method for holding data as claimed in claim 13, wherein the step of coupling a gate electrode of the low threshold n-channel insulated gate field effect transistor for receiving an enable signal further includes the step of generating the enable signal in a voltage range between the first biasing voltage and the second biasing voltage.

17. The method for holding data as claimed in claim 16, wherein the step of disconnecting a current path from the input port to the second biasing node further includes the step of switching off the low threshold n-channel insulated gate field effect transistor in response to a voltage at a source electrode of the low threshold n-channel insulated gate field effect transistor being higher than the enable signal at the gate electrode of the low threshold n-channel insulated gate field effect transistor.

18. The method for holding data as claimed in claim 13, further comprising the step of switching off the low threshold n-channel insulated gate field effect transistor in response to the enable signal being at a second voltage level.

* * * * *